(12) United States Patent
Chen et al.

(10) Patent No.: US 12,133,421 B2
(45) Date of Patent: Oct. 29, 2024

(54) DISPLAY PANEL, MANUFACTURING METHOD THEREOF, AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Yuanpeng Chen, Shenzhen (CN); Yuanjun Hsu, Shenzhen (CN)

(*) Notice: Subject to any disclaimer, the term of this patent is extended or adjusted under 35 U.S.C. 154(b) by 578 days.

(21) Appl. No.: 17/419,733

(22) PCT Filed: May 27, 2021

(86) PCT No.: PCT/CN2021/096484
§ 371 (c)(1),
(2) Date: Jun. 30, 2021

(87) PCT Pub. No.: WO2022/188275
PCT Pub. Date: Sep. 15, 2022

(65) Prior Publication Data
US 2023/0157080 A1 May 18, 2023

(30) Foreign Application Priority Data
Mar. 9, 2021 (CN) .......................... 202110258219.1

(51) Int. Cl.
*H10K 59/122* (2023.01)
*H10K 59/12* (2023.01)
*H10K 71/13* (2023.01)

(52) U.S. Cl.
CPC ....... *H10K 59/122* (2023.02); *H10K 59/1201* (2023.02); *H10K 71/135* (2023.02)

(58) Field of Classification Search
CPC .................................................. H10K 59/122
See application file for complete search history.

(56) References Cited

U.S. PATENT DOCUMENTS

| | | | |
|---|---|---|---|
| 2004/0119066 A1 | 6/2004 | Han | |
| 2014/0329056 A1 | 11/2014 | Hou | |
| 2016/0172424 A1* | 6/2016 | Hosono | ............... H10K 59/122 257/40 |
| 2018/0122875 A1* | 5/2018 | Bang | ................... H10K 59/123 |

(Continued)

FOREIGN PATENT DOCUMENTS

| | | |
|---|---|---|
| CN | 101543134 A | 9/2009 |
| CN | 108258010 A | 7/2018 |

(Continued)

*Primary Examiner* — Ictor A Mandala
*Assistant Examiner* — Lawrence C Tynes, Jr.

(57) ABSTRACT

The present application provides a display panel, a manufacturing method thereof, and a display device; first intervals and second intervals are defined between a plurality of first electrodes, a plurality of first pixel banks are arranged corresponding to the first intervals, and a plurality of second pixel banks are arranged corresponding to the second intervals, wherein the second pixel banks cross over the first pixel banks, and a thickness of the second pixel banks is greater than a thickness of the first pixel banks, so that light-emitting materials of a same color can be continuously printed between adjacent ones of the second pixel banks.

16 Claims, 8 Drawing Sheets

(56) References Cited

U.S. PATENT DOCUMENTS

| | | | | |
|---|---|---|---|---|
| 2018/0190740 A1* | 7/2018 | Bang | .................... | H10K 59/122 |
| 2019/0237525 A1* | 8/2019 | Zhao | .................... | H10K 50/805 |
| 2019/0363139 A1* | 11/2019 | Nishioka | ................ | H05B 33/22 |
| 2020/0091254 A1* | 3/2020 | Cui | ....................... | H10K 59/122 |
| 2020/0251541 A1* | 8/2020 | Kim | ....................... | H10K 71/00 |

FOREIGN PATENT DOCUMENTS

| | | |
|---|---|---|
| CN | 108598110 A | 9/2018 |
| CN | 109817816 A | 5/2019 |
| CN | 111200004 A | 5/2020 |
| CN | 111293141 A | 6/2020 |
| CN | 111312760 A | 6/2020 |
| CN | 112234080 A | 1/2021 |
| CN | 112310176 A | 2/2021 |
| EP | 2535956 A1 | 12/2012 |
| KR | 20170080242 A | 7/2017 |
| WO | 2012049717 A1 | 4/2012 |

* cited by examiner

```
┌─────────────────────────────────────────────┐
│ providing an array substrate and forming a plurality of │
│ first electrodes arranged in an array on the array      │
│ substrate, wherein each of first intervals is formed    │───S301
│ between adjacent ones of the first electrodes in a first│
│ direction, and each of second intervals is formed       │
│ between adjacent ones of the first electrodes in a      │
│ second direction;                                       │
└─────────────────────────────────────────────┘
                       ⇩
┌─────────────────────────────────────────────┐
│ forming first pixel banks in the first intervals, wherein│
│ a thickness of the first pixel banks is greater than a  │───S302
│ thickness of the first electrodes;                      │
└─────────────────────────────────────────────┘
                       ⇩
┌─────────────────────────────────────────────┐
│ forming second pixel banks in the second intervals to   │
│ form a pixel definition layer, wherein a thickness of   │
│ the second pixel banks is greater than the thickness of │
│ the first pixel banks, and the second pixel banks       │───S303
│ covers portions of the first pixel banks and portions of│
│ the first electrodes, so that each of printing grooves is│
│ formed between adjacent ones of the second pixel        │
│ banks;                                                  │
└─────────────────────────────────────────────┘
                       ⇩
┌─────────────────────────────────────────────┐
│ continuously printing light-emitting materials of a     │
│ same color in a same one of the printing grooves, and   │
│ printing light-emitting materials of different colors in│───S304
│ different ones of the printing grooves to form a light- │
│ emitting layer, wherein the light-emitting layer is     │
│ formed on the first electrodes which are not covered by │
│ the second pixel banks; and                             │
└─────────────────────────────────────────────┘
                       ⇩
┌─────────────────────────────────────────────┐
│ depositing second electrodes on the light-emitting      │───S305
│ layer.                                                  │
└─────────────────────────────────────────────┘
```

FIG. 9

DISPLAY PANEL, MANUFACTURING METHOD THEREOF, AND DISPLAY DEVICE

BACKGROUND OF INVENTION

Field of Invention

The present application relates to the field of display technology, and in particular to a display panel, a manufacturing method thereof, and a display device.

Description of Prior Art

Compared with liquid crystal display (LCD), active matrix organic light-emitting display (AMOLED) has advantages of high color gamut, high contrast, flexibility, and wearability. According to manufacturing processes of OLED, the manufacturing of AMOLED can be divided into evaporation coating type and ink jet print (IJP) type. For manufacturing of large-size display backplanes, use of evaporation coating technology needs to rely on white light OLED (WOLED) combined with color filters (CFs) to achieve color display, while CF-free display corresponding to a fine mask cannot be applied to mass production of large-size display backplanes in high-generation production lines. The inkjet printing process has overcome shortcomings of the evaporation coating technology to a certain extent, can directly realize printing of full-color pixels in the big generation production line, and greatly improves use efficiency of OLED materials. The inkjet printing process needs to rely on a specially designed pixel definition layer. A pixel definition layer of traditional side by side (SBS) type design performs pixel opening on an entire patterned surface of the pixel definition layer, and the OLED materials are printed in the openings. However, the OLED materials of a same color are separated by the pixel definition layer, and continuous printing of the inkjet printing process cannot be realized, which greatly limits advantages of printing technology and reduces printing efficiency.

Therefore, there is a need to solve the problem that the pixel definition layer of the existing SBS-type design impacts the printing efficiency.

SUMMARY OF INVENTION

The present application provides a display panel, a manufacturing method thereof, and a display device to alleviate the technical problem that the pixel definition layer of the existing SBS-type design impacts printing efficiency.

In order to solve the above problems, the technical solutions provided by the present application are as follows:

An embodiment of the present application provides a display panel, wherein a pixel definition layer of the display panel includes:
  a plurality of first pixel banks arranged along a first direction; and
  a plurality of second pixel banks arranged along a second direction, wherein adjacent ones of the first pixel banks and adjacent ones of the second pixel banks surround to define one of light-exiting areas; and an included angle is formed between the first direction and the second direction,
  wherein, in the second direction, light-emitting materials in the light-exiting areas are the same; a thickness of the second pixel banks is greater than a thickness of the first pixel banks.

In the display panel provided by the embodiment of the present application, a material of the first pixel banks includes a hydrophilic organic material.

In the display panel provided by the embodiment of the present application, a material of the second pixel banks includes a hydrophobic organic material.

In the display panel provided by the embodiment of the present application, the first pixel banks and the second pixel banks are integrally disposed.

In the display panel provided by the embodiment of the present application, in the first direction, the light-emitting materials in adjacent ones of the light-exiting areas are different.

In the display panel provided by the embodiment of the present application, the display panel includes:
  an array substrate;
  a plurality of first electrodes arranged in an array on the array substrate, wherein each of first intervals is formed between adjacent ones of the first electrodes in the first direction, and each of second intervals is formed between adjacent ones of the first electrodes in the second direction; and
  wherein the pixel definition layer is disposed on the first electrodes and the array substrate, the first pixel banks are disposed in the first intervals and cover portions of the first electrodes; and the second pixel banks are arranged in the second intervals and cover the first pixel banks and portions of the first electrodes; and
  wherein the light-exiting areas defined by the pixel definition layer correspond to the first electrodes, and the light-emitting materials covering the first electrodes form a light-emitting layer.

In the display panel provided by the embodiment of the present application, the thickness of the first pixel banks is greater than or equal to a thickness of the light-emitting layer.

In the display panel provided by the embodiment of the present application, the thickness of the first pixel banks is greater than a thickness of the first electrodes.

In the display panel provided by the embodiment of the present application, the thickness of the first pixel banks ranges from 0.1 micrometers to 0.6 micrometers, and the thickness of the second pixel banks ranges from 0.8 micrometers to 2 micrometers.

Another embodiment of the present application also provides a method of manufacturing a display panel, which includes the following steps: providing an array substrate and forming a plurality of first electrodes arranged in an array on the array substrate, wherein each of first intervals is formed between adjacent ones of the first electrodes in the first direction, and each of second intervals is formed between adjacent ones of the first electrodes in the second direction; forming first pixel banks in the first intervals, wherein a thickness of the first pixel banks is greater than a thickness of the first electrodes; forming second pixel banks in the second intervals to form a pixel definition layer, wherein a thickness of the second pixel banks is greater than the thickness of the first pixel banks, and the second pixel banks cover portions of the first pixel banks and portions of the first electrodes, so that each of printing grooves is formed between adjacent ones of the second pixel banks; continuously printing light-emitting materials of a same color in a same one of the printing grooves, and printing light-emitting materials of different colors in different ones of the printing grooves to form a light-emitting layer, wherein the light-emitting layer is formed on the first electrodes which are not covered by the second pixel banks; and depositing second electrodes on the light-emitting layer.

In the method of manufacturing the display panel provided by an embodiment of the present application, a material of the first pixel banks includes a hydrophilic organic material, and a material of the second pixel banks includes a hydrophobic organic material.

Still another embodiment of the present application also provides a display device, which includes the display panel of one of the foregoing embodiments.

In the display panel, the manufacturing method thereof, and the display device provided by the present application, a plurality of first electrodes are arranged on an array substrate of the display device, first intervals and second intervals are defined between the plurality of first electrodes, a plurality of first pixel banks are arranged corresponding to the first intervals, and a plurality of second pixel banks are arranged corresponding to the second intervals, wherein the second pixel banks cross over the first pixel banks, a thickness of each of the first pixel banks and the second pixel banks is greater than a thickness of the first electrodes, and the thickness of the second pixel banks is greater than the thickness of the first pixel banks, so that the light-emitting materials of a same color can be continuously printed between adjacent ones of the second pixel banks, which solves the problem that the pixel definition layer of the existing SBS-type design cannot be continuously printed, which impacts printing efficiency. Meanwhile, the first pixel banks are made of a hydrophilic organic material, which can quickly disperse the printed light-emitting materials in areas defined by the first pixel banks, thereby improving the printing efficiency; and the second pixel banks are made of a hydrophobic organic material to prevent the printed light-emitting materials from overflowing and causing color mixing.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these FIGS. without paying creative work.

FIG. 9 is a schematic flowchart of a method of manufacturing a display panel provided by an embodiment of the present application.

DETAILED DESCRIPTION OF PREFERRED EMBODIMENTS

Figure 1:
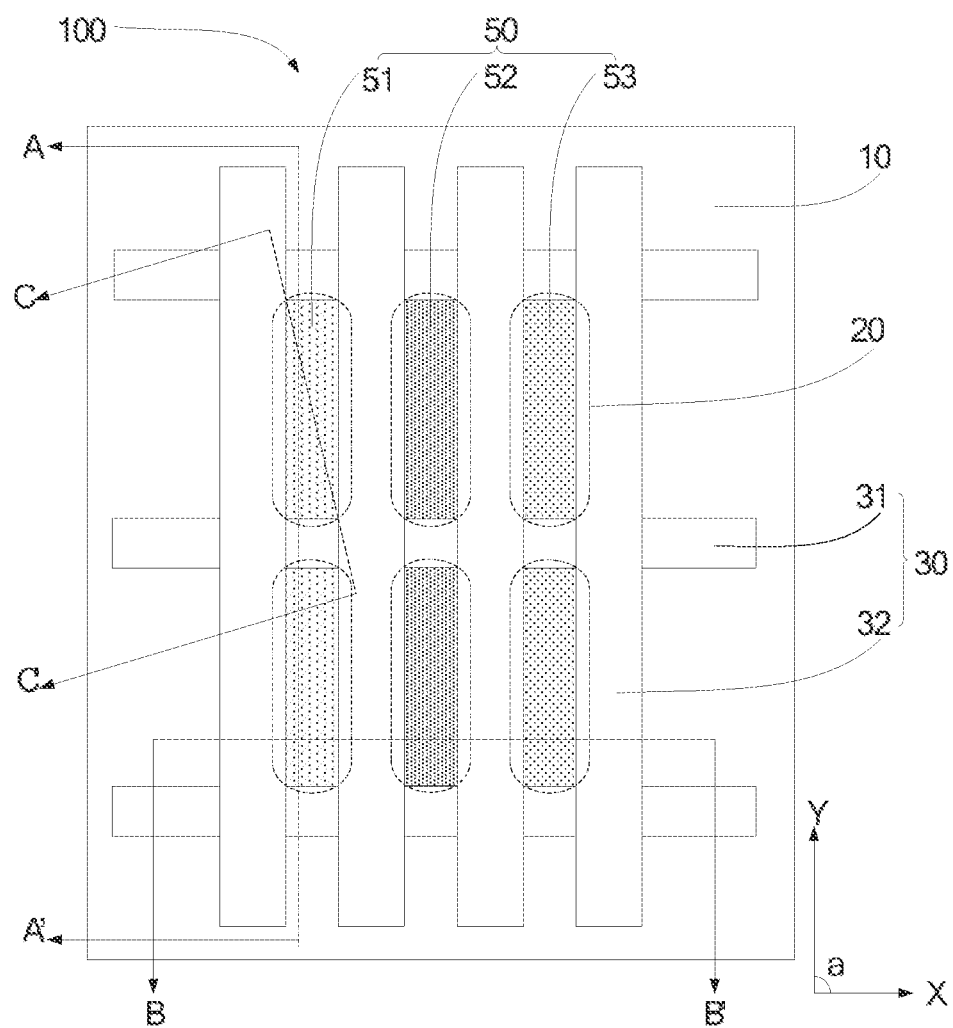
FIG. 1 is a schematic structural diagram illustrating a top view of a display panel provided by an embodiment of the present application.

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the drawings, structurally similar elements are denoted by the same reference numerals. In the drawings, the thickness of some layers and areas is exaggerated for clear understanding and ease of description. That is, the size and thickness of each component shown in the drawings are arbitrarily shown, but the present application is not particularly limited thereto.

In an embodiment, refer to FIG. 1, which is a schematic structural diagram illustrating a top view of a display panel provided by an embodiment of the present application. A display panel 100 includes an OLED display panel, etc., for example, an AMOLED display panel. The display panel 100 includes an array substrate 10, a plurality of first electrodes 20, a pixel definition layer 30, a light-emitting layer 50, etc., wherein the pixel definition layer 30 includes a plurality of first pixel banks 31 arranged along a first direction X and a plurality of second pixel banks 32 arranged along a second direction Y, and a thickness of the second pixel banks 32 is greater than a thickness of the first pixel banks 31. In addition, adjacent ones of the first pixel banks 31 and adjacent ones of the second pixel banks 32 surround to define one of light-exiting areas. Light-emitting materials are arranged in the light-exiting areas to form the light-emitting layer 50.

An included angle a is formed between the first direction X and the second direction Y, and the included angle a may be greater than 0 degrees and less than 180 degrees. As shown in FIG. 1, the first direction X is parallel to a horizontal side of the array substrate 10, the second direction Y is parallel to a vertical side of the array substrate 10, and the included angle a is 90 degrees at this time. In the second direction Y, the light-emitting materials in the light-exiting areas are the same.

Figure 2:
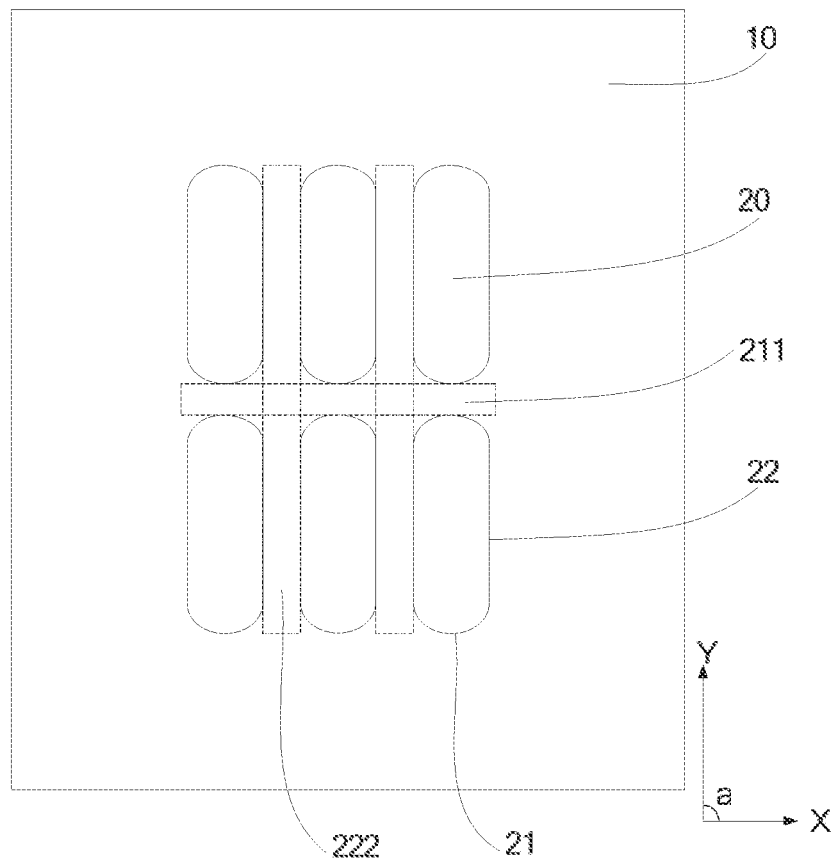
FIG. 2 is a schematic structural diagram illustrating a top view of an arrangement of a first electrode array according to an embodiment of the present application.

Specifically, refer to FIG. 2, which is a schematic structural diagram illustrating a top view of an arrangement of a first electrode array according to an embodiment of the present application. A plurality of first electrodes 20 are arranged in an array on the array substrate 10, a first interval 211 is formed between adjacent ones of the first electrodes 20 in the first direction X, and a second interval 222 is formed between adjacent ones of the first electrodes 20 in the second direction Y. Exemplarily, each of the first electrodes 20 includes a short side 21 and a long side 22, the short side 21 is arranged along the first direction X, and the long side 22 is arranged along the second direction Y The short side 21 of the first electrode 20 refers to a side of the first electrode 20 with a shorter side length in a top view. A shape of the short side 21 can be a straight line, a broken line, an arc, etc., and as shown in FIG. 2, a shape of the short side 21 of the first electrode 20 is a circular arc. Of course, the long side 22 of the first electrode 20 refers to a side of the first electrode 20 with a longer side length in a top view.

Optionally, the first electrodes 20 are arranged in an array on the array substrate 10 into multiple rows and multiple columns, the row refers to an arrangement along the first direction X, and the column refers to an arrangement along the second direction Y, wherein the first electrodes 20 in each row are parallel to each other, and the first electrodes 20 in each column are also parallel to each other. When the included angle a between the first direction X and the second direction Y is 90 degrees, each row and each column are perpendicular to each other, so that the first interval 211 and the second interval 222 also perpendicularly intersect each other. Of course, the present application is not particularly limited to this. The rows and columns of the first electrodes 20 of the present application may also be arranged to have a certain included angle, so that the first interval 211 and the second interval 222 are also arranged to have a certain included angle.

Figure 3:
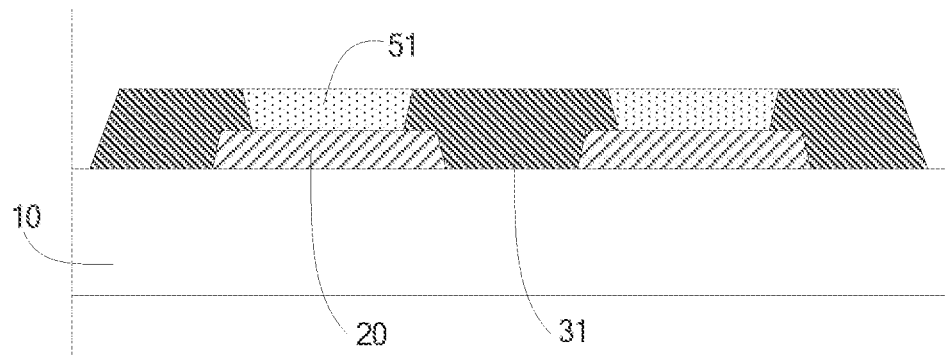
FIG. 3 is a schematic cross-sectional structural diagram along an A-A' direction in FIG. 1.
Figure 4:
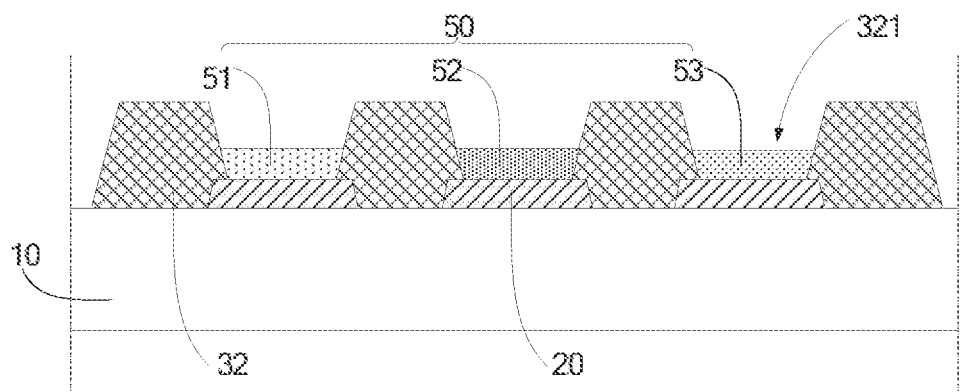
FIG. 4 is a schematic cross-sectional structural diagram along a B-B' direction in FIG. 1.
Figure 5:
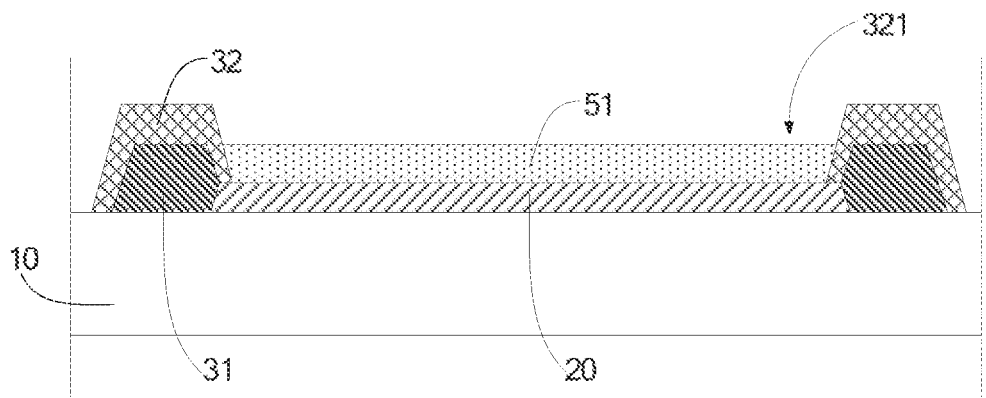
FIG. 5 is a schematic cross-sectional structural diagram along a C-C' direction in FIG. 1.

Referring to FIGS. 1 to 5 in conjunction, FIG. 3 is a schematic cross-sectional structural diagram along an A-A' direction in FIG. 1, FIG. 4 is a cross-sectional structure schematic diagram along a B-B' direction in FIG. 1, and FIG. 5 is a cross-sectional structure schematic diagram along a C-C' direction in FIG. 1. The first pixel banks 31 are disposed in the first intervals 211 and cover portions of the first electrodes 20. The thickness of the first pixel banks 31 is greater than the thickness of the first electrodes 20, so the first pixel banks 31 fill the first intervals 211 and exceed the thickness of the first electrodes 20, and cover portions of the short sides 21 of the first electrodes 20. As shown in FIG. 1, the short side 21 of each of the first electrodes 20 has a shape of a circular arc, and the first pixel banks 31 cover portions of the circular arcs.

The second pixel banks 32 are disposed in the second intervals 222 and cover the first pixel banks 31 and portions of the first electrodes 20. The thickness of the second pixel banks 32 is greater than the thickness of the first electrodes 20, so the second pixel banks 32 fill the second intervals 222 and exceed the thickness of the first electrodes 20, and cover the long sides 22 of the first electrodes 20 and portions of the short sides 21 which are not covered by the first pixel banks 31, so as to define the light-exiting areas by the first pixel banks 31 and the second pixel banks 32.

Meanwhile, the thickness of the second pixel banks 32 is greater than the thickness of the first pixel banks 31, and in areas where the second pixel banks 32 intersect the first pixel banks 31, the second pixel banks 32 cover the first pixel banks 31, as shown in FIG. 5.

Optionally, the thickness of the first pixel banks 31 ranges from 0.1 μm to 0.6 μm, and the thickness of the second pixel banks 32 ranges from 0.8 μm to 2 μm.

It should be noted that the short side 21 of each of the first electrodes 20 is a circular arc, the first pixel banks 31 cover portions of the short sides 21 of the first electrodes 20, and the second pixel banks 32 cover the long sides 22 of the first electrodes 20 and portions of the short sides 21 not covered by the first pixel banks 31, so as shown in FIG. 5, the second pixel banks 32 still cover the first pixel bank 31 at a position close to the light-exiting areas.

Since the thickness of the second pixel banks 32 is greater than the thickness of the first pixel banks 31, each of printing grooves 321 is formed between adjacent ones of the second pixel banks 32, and the light-emitting materials can be continuously printed along an extension direction of the printing grooves 321 to form the light-emitting layer 50.

Specifically, the light-emitting layer 50 is disposed on the first electrodes 20 that are not covered by the second pixel banks 32. The light-emitting layer 50 is formed by printing light-emitting materials of different colors in different ones of the printing grooves 321 to form a light-emitting layer. By printing light-emitting materials of a same color in a same one of the printing grooves 321, the light-emitting materials of the same color are arranged between adjacent ones of the second pixel banks 32, so that in the second direction Y, the light-emitting materials in the light-exiting areas are the same. Optionally, the light-emitting materials of the light-emitting layer 50 include a red light-emitting material 51, a green light-emitting material 52, and a blue light-emitting material 53.

Further, referring to FIG. 1 in conjunction with FIG. 4, the red light-emitting material 51, the green light-emitting material 52, and the blue light-emitting material 53 are respectively arranged in different printing grooves 321. Of course, FIG. 4 schematically shows three printing grooves 321, but the display panel 100 may include more first electrodes 20, so that more second pixel banks 32 can be provided to form more printing grooves 321, and thus the red light-emitting material 51, the green light-emitting material 52, and the blue light-emitting material 53 are sequentially and cyclically arranged in the more printing grooves 321. The thickness of the second pixel banks 32 is greater than a thickness of the light-emitting layer 50.

Meanwhile, referring to FIG. 1, the light-emitting materials of the same color printed between adjacent ones of the second pixel banks 32 are separated by the first pixel banks 31, so that the light-emitting materials only cover the first electrode 20 in the light-exiting areas, but not cover the first pixel bank 31. In addition, the light-emitting materials with different colors are printed in different printing grooves 321, so that the light-emitting materials of different colors are arranged at intervals between adjacent ones of the first pixel banks 31, and as such, in the first direction X, the light-emitting materials in adjacent ones of the light-emitting areas are different. That is, the first pixel banks 31 are used to define the light-emitting materials of the same color, and the second pixel banks 32 are used to define the light-emitting materials of different colors.

Optionally, the thickness of the first pixel banks 31 is greater than or equal to the thickness of the light-emitting layer 50.

Optionally, a material of the first pixel banks 31 includes a hydrophilic organic material, and the first pixel banks 31 made of the hydrophilic organic material have hydrophilic characteristics. The material of the second pixel banks 32 includes a hydrophobic organic material, for example, a fluorine-containing organic material having hydrophobic characteristics, and the second pixel banks 32 made of a hydrophobic organic material have hydrophobic characteristics.

It should be noted that when preparing the light-emitting layer 50, light-emitting materials of different colors are dissolved in a solvent to form different inks, and inks of different concentrations are formulated according to the thickness of the light-emitting layer 50 to be prepared. Then, the inks are printed in the printing grooves 321 formed between adjacent ones of the second pixel banks 32 by inkjet printing, and the inks are cured into a film to form the light-emitting layer 50.

When printing ink in the printing grooves 321, a volume of the inks is much larger than the volume of the light-emitting layer 50 after curing and forming into a film. Since the inks have fluidity, the first pixel banks 31 with hydrophilic characteristics can accelerate the flow of ink in the printing grooves 321 at this time so that the printed ink can be quickly dispersed in the areas defined by the first pixel banks 31 to prevent inks from accumulating and overflowing in a certain area, which can further improve efficiency of continuous printing. Meanwhile, the second pixel banks 32 with hydrophobic characteristics can prevent the printed inks from overflowing into adjacent ones of the printing grooves 321 and causing color mixing. Of course, the thickness of the second pixel banks 32 needs to match a height of the printed inks.

Figure 6:
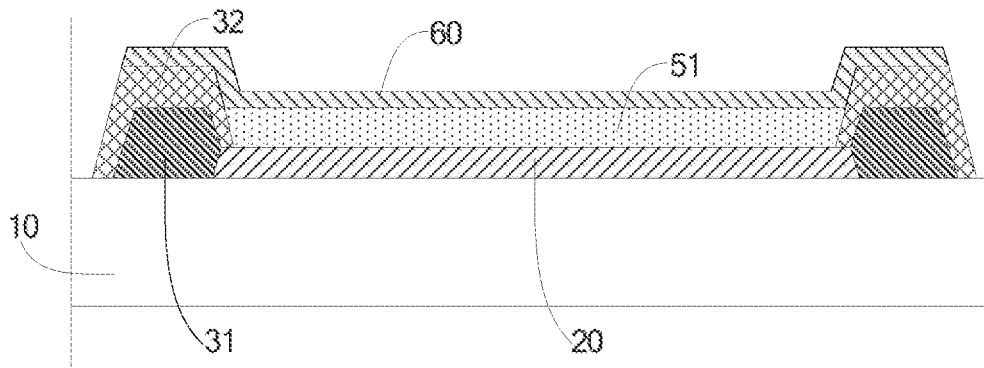
FIG. 6 is a schematic cross-sectional structural diagram of the display panel provided by an embodiment of the present application.

In addition, in order to realize light emission of the light-emitting layer 50, a second electrode 60 needs to be further provided, and the second electrode 60 covers the light-emitting layer 50 and the second pixel bank 32, as shown in FIG. 6. The first electrode 20 is an anode, and the second electrode 60 is a cathode, but the present application is not particularly limited thereto. The light-emitting layer 50 emits light under a collaboration of the first electrode 20 and the second electrode 60, and the array substrate 10 provides a driving voltage for the first electrode 20.

Figure 7:
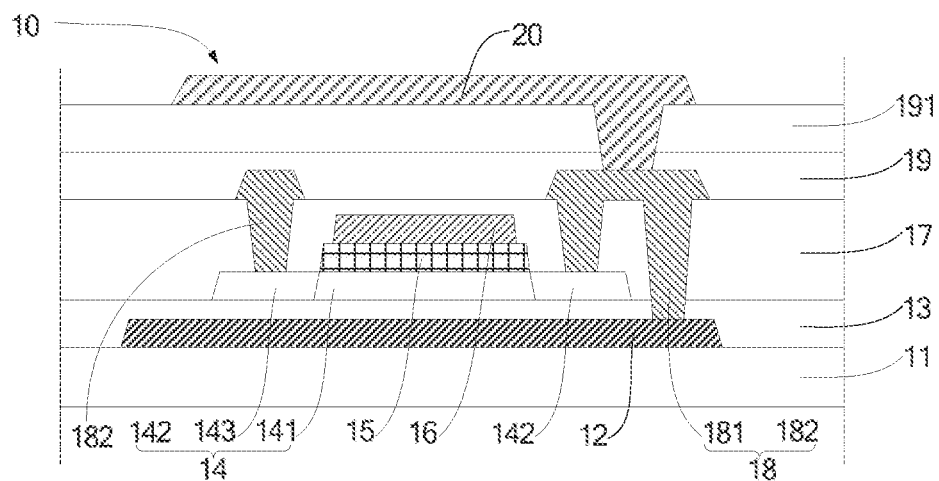
FIG. 7 is a schematic diagram of a cross-sectional structure of an array substrate provided by an embodiment of the present application.

Refer to FIG. 7, which is a schematic diagram of a cross-sectional structure of an array substrate provided by an embodiment of the present application. Optionally, the array substrate 10 may include a base substrate 11, and a light-shielding layer 12, a buffer layer 13, an active layer 14, a gate insulating layer 15, a gate 16, an interlayer insulating layer 17, a source/drain layer 18, a passivation layer 19, and a planarization layer 191 which are sequentially stacked on the base substrate 11.

Optionally, the base substrate 11 may be a rigid substrate or a flexible substrate. When the base substrate 11 is a rigid substrate, it may include a rigid substrate such as a glass substrate, etc.; meanwhile, when the base substrate 11 is a flexible substrate, it may include a flexible substrate such as a polyimide (PI) film, an ultra-thin glass film, etc.

Optionally, a material of the buffer layer 13 may include an inorganic material such as silicon oxide, silicon nitride, silicon oxynitride, etc., and the buffer layer 13 may prevent undesired impurities or contaminants (such as moisture, oxygen, etc.) from diffusing from the base substrate 11 into devices that may be damaged by these impurities or contaminants, and meanwhile can provide a flat top surface.

Optionally, a material of the active layer 14 may be a metal oxide semiconductor material, such as IGZO, ITZO, or IGZTO. The active layer 14 includes a channel area 141, a source area 142, and a drain area 143. The light-shielding layer 12 is disposed corresponding to the active layer 14, and the light-shielding layer 12 may be a metal light-shielding layer for shielding the active layer 14 to prevent light from irradiating the channel area 141. The gate 16 and the gate insulating layer 15 are both arranged corresponding to the channel area 141.

The source/drain layer 18 includes a source 181 and a drain 182. The drain 182 is connected to the drain area 143 through a via hole of the interlayer insulating layer 17, the source 181 is connected to the source area 142 through another via hole of the interlayer insulating layer 17, and the source 181 is also connected to the light-shielding layer 12 through a via hole penetrating the interlayer insulating layer 17 and the buffer layer 13.

The passivation layer 19 covers the source/drain layer 18 and the interlayer insulating layer 17, and the planarization layer 191 covers the passivation layer 19. A material of the planarization layer 191 includes an organic material such as organic photoresist, and the planarization layer 191 can provide a flat top surface for the array substrate 10. The array substrate 10 is further provided with an opening penetrating through the planarization layer 191 and the passivation layer 19, the opening exposes the source 181, and the first electrode 20 is connected to the source 181 through the opening.

It should be noted that this embodiment schematically shows a structure of the array substrate 10, but the present application is not particularly limited thereto, and the array substrate 10 of the present application may also be other types of array substrates, such as gate driver on array (GOA) substrate, etc., which will not be repeated herein for brevity.

In addition, the display panel 100 may further include an encapsulation layer (not shown) disposed on the second electrode 60, the encapsulation layer may adopt thin film encapsulation, and the thin film encapsulation may be a stack structure composed of a first inorganic encapsulation layer, an organic encapsulation layer, and the second inorganic encapsulation layer which are stacked in sequence, or may be a stack structure of more layers, which are used to protect the light-emitting layer 50 by preventing water and oxygen from entering the light-emitting layer 50 and causing failure of the light-emitting material of the light-emitting layer 50.

In this embodiment, the first pixel banks 31 and the second pixel banks 32 are provided on the array substrate 10, and the second pixel banks 32 cross over the first pixel banks 31, and the thickness of the second pixel banks 32 is greater than the thickness of the first pixel banks 31, so that the light-emitting materials of a same color can be continuously printed between adjacent ones of the second pixel banks 32, which solves the problem that the pixel definition layer of the existing SBS-type design cannot be continuously printed and impacts printing efficiency. Meanwhile, the first pixel banks 31 are made of a hydrophilic organic material, which can quickly disperse the printed light-emitting materials in areas defined by the first pixel banks 31, thereby improving the printing efficiency; and the second pixel banks 32 are made of a hydrophobic organic material to prevent the printed light-emitting materials from overflow causing color mixing.

Figure 8:
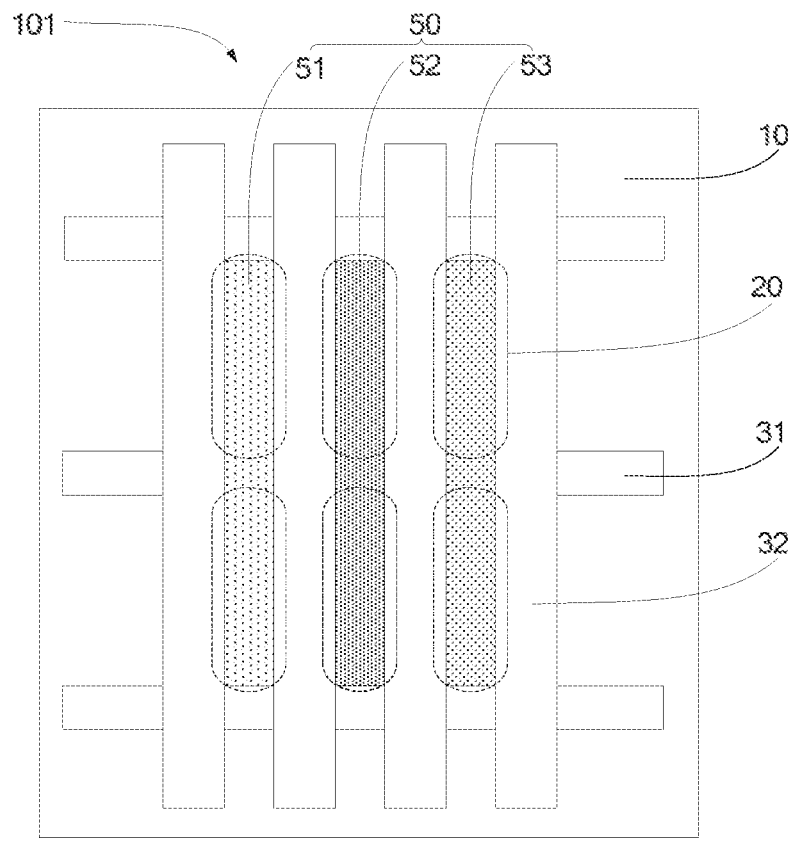
FIG. 8 is a schematic structural diagram illustrating a top view of a display panel provided by another embodiment of the present application.

In an embodiment, refer to FIG. 8, which is a schematic structural diagram illustrating a top view of a display panel provided by another embodiment of the present application. A difference from the foregoing embodiments is that in the display panel 101 shown in FIG. 8, the first pixel banks 31 between adjacent ones of the second pixel banks 32 are covered with the light-emitting material. A thickness of the first pixel banks 31 may be less than a thickness of the light-emitting layer 50, and continuous printing can still be used when printing light-emitting materials to form the light-emitting layer 50, which improves printing efficiency, and the formed light-emitting layer 50 is also continuous. Related descriptions can be referred to the above-mentioned embodiments, which will not be repeated herein for brevity.

In an embodiment, a difference from the foregoing embodiments is that the first pixel banks 31 and the second pixel banks 32 are integrally arranged, and the first pixel banks 31 and the second pixel banks 32 are formed of the same material under the same process conditions simultaneously. Optionally, a half-tone mask (HTM) is used to perform a photolithography process on a blanket pixel definition layer 30 covering the first electrode 20 and the array substrate 10, so that the pixel definition layer 30 is formed with thinner first pixel banks 31 in a first direction X, and formed with thicker second pixel banks 32 in a second direction Y, thereby forming the pixel definition layer 30 structure as shown in FIG. 1. A material of the pixel definition layer 30 includes a hydrophobic organic material or the like. Related descriptions can be referred to the above-mentioned embodiments, which will not be repeated herein for brevity.

In an embodiment, refer to FIG. 9, which is a schematic flowchart of a method of manufacturing a display panel provided by an embodiment of the present application. The method of manufacturing the display panel includes the following steps:

S301: providing an array substrate 10 and forming a plurality of first electrodes 20 arranged in an array on the array substrate 10, wherein each of first intervals 211 is formed between adjacent ones of the first electrodes 20 in a first direction X, and each of second intervals 222 is formed between adjacent ones of the first electrodes in a second direction Y.

Specifically, referring to FIG. 2 in conjunction with FIG. 7, an array substrate 10 as shown in FIG. 7 is provided. The array substrate 10 includes a base substrate 11, and a light-shielding layer 12, a buffer layer 13, an active layer 14, a gate insulating layer 15, a gate 16, an interlayer insulating layer 17, a source/drain layer 18, a passivation layer 19, and a planarization layer 191 which are sequentially stacked on the base substrate 11.

Specifically, the base substrate 11 is provided. The base substrate 11 may be a rigid substrate or a flexible substrate. When the base substrate 11 is a rigid substrate, it may include a rigid substrate such as a glass substrate, etc.; meanwhile, when the base substrate 11 is a flexible substrate, it may include a flexible substrate such as a polyimide film, an ultra-thin glass film, etc.

Optionally, a metal layer is deposited on the base substrate 11, the metal layer may be a single layer or a stack of multiple metal layers, and the metal layer is patterned to form the light-shielding layer 12 with wiring and light-shielding functions.

Optionally, a deposition process such as plasma enhanced chemical vapor deposition (PECVD) is used to deposit a buffer layer 13 on the light-shielding layer 12 and the base substrate 11. A material of the buffer layer 13 may be an inorganic material such as silicon oxide, silicon nitride, silicon oxynitride, etc., for example one or a combination of Si3N4, SiO2, SiON, and the like. A thickness of the buffer layer 13 may range from 1000 angstroms to 5000 angstroms.

Optionally, a deposition process such as physical vapor deposition (PVD) is used to deposit a metal oxide semiconductor material on the buffer layer 13, and the metal oxide semiconductor material may be IGZO, ITZO, IGZTO, or the like. The metal oxide semiconductor is patterned to form the active layer 14, and a thickness of the active layer 14 may range from 100 angstroms to 1000 angstroms.

Optionally, a deposition process such as plasma enhanced chemical vapor deposition (PECVD) is used to deposit a gate dielectric material on the active layer 14 and the buffer layer 13, and the gate dielectric material includes SiOx or the like. A thickness of the deposited gate dielectric material may range from 500 angstroms to 2000 angstroms.

Optionally, a deposition process such as physical vapor deposition (PVD) is used to deposit a gate metal layer on the gate dielectric material, and the gate metal layer is patterned to form a gate pattern. Using the gate pattern as a mask, the gate dielectric material is etched, and the gate 16, the gate insulating layer 15, and a channel area 141 of the active layer 14 are formed in a self-aligned manner, so that the active layer 14 is divided into the channel area 141, a source area 142, and a drain area 143.

Optionally, a deposition process such as PECVD is used to deposit an inorganic film such as SiO2 on the gate 16, the active layer 14, and the buffer layer 13 to form the interlayer insulating layer 17, and a thickness of the interlayer insulating layer 17 may range from 2000 angstroms to 8000 angstroms. The interlayer insulating layer 17 and the buffer layer 13 are patterned to form a plurality of via holes.

Optionally, a deposition process such as PVD is used to deposit a source/drain metal layer on the interlayer insulating layer 17, and the source/drain metal layer is patterned to form a source/drain layer 18. The source/drain layer 18 includes a source 181 and a drain 182. The drain 182 is connected to the drain area 143 of the active layer 14 through a via hole of the interlayer insulating layer 17. The source 181 is connected to the source area 142 of the active layer 14 through another via hole of the interlayer insulating layer 17, and also connected to the light-shielding layer 12 through a via hole penetrating the interlayer insulating layer 17 and the buffer layer 13.

Optionally, a deposition process such as PECVD is used to deposit an inorganic film such as SiO2 on the source/drain layer 18 and the interlayer insulating layer 17 to form the passivation layer 19, and a thickness of the passivation layer 19 may range from 1000 angstroms to 5000 Angstroms. Hereafter, a planarization layer 191 is deposited on the passivation layer 19, and a material of the planarization layer 191 includes organic photoresist or the like. The planarization layer 191 and the passivation layer 19 are patterned to form openings, thus completing fabrication of the array substrate 10.

Further, an electrode material is deposited on the array substrate 10, and the electrode material is patterned to form a plurality of first electrodes 20 arranged in an array, as shown in FIG. 2. The electrode material includes a transparent conductive electrode material, such as indium tin oxide (ITO) or the like. Of course, the present application is not particularly limited thereto, and the first electrodes 20 of the present application may also be opaque electrodes, which may be specifically determined according to the light-emitting direction of the display panel 100.

Optionally, a plurality of first electrodes 20 are arranged in an array on the array substrate 10, first intervals 211 are formed between adjacent ones of the first electrodes 20 in the first direction X, and second intervals 222 are formed between adjacent ones of the first electrodes 20 in the second direction Y. Exemplarily, the first electrode 20 includes a short side 21 and a long side 22. The short side 21 is arranged along the first direction X, and the long side 22 is arranged along the second direction Y. There are first intervals 211 between the short sides 21 of adjacent ones of the first electrode 20, and there are second intervals 222 between the long sides 22 of adjacent ones of the first electrodes 20.

S302: forming first pixel banks 31 in the first intervals 211, wherein a thickness of the first pixel banks 31 is greater than a thickness of the first electrodes 20, so that the first pixel banks 31 cover portions of the first electrodes 20.

Figure 10:
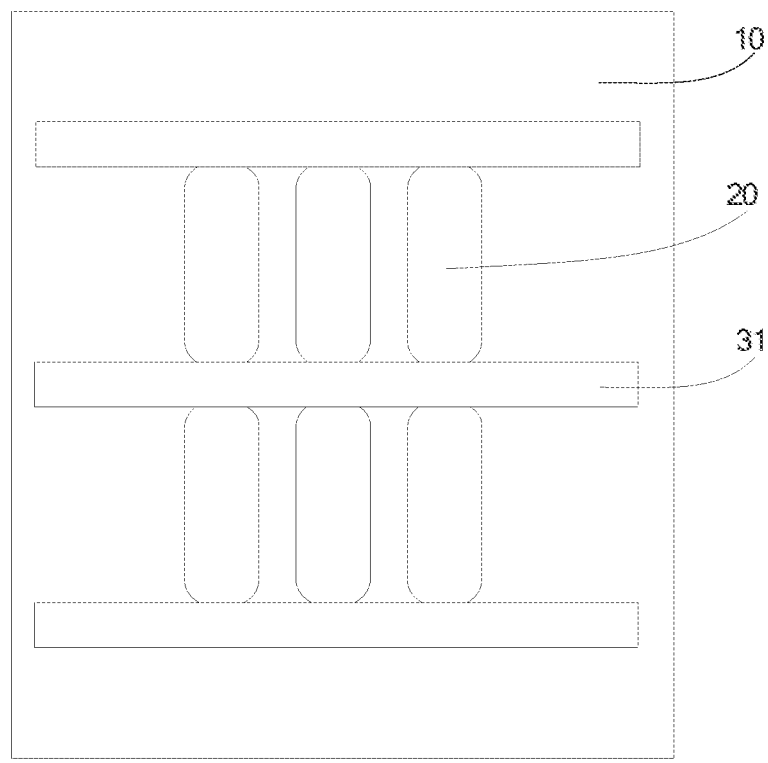
FIG. 10 to FIG. 12 are schematic structural diagrams illustrating a partial top view of the display panel manufactured in each step of the display panel manufacturing method provided by the embodiments of the present application.

Specifically, a hydrophilic organic material is blanketly deposited on the first electrode 20 and the array substrate 10, and the hydrophilic organic material is patterned to form the first pixel banks 31. The first pixel banks 31 correspond to the first intervals 211, and the first pixel banks 31 cover portions of the first electrodes 20. As shown in FIG. 10, the first pixel banks 31 cover the portions of the short sides 21 of the first electrodes 20. The thickness of the first pixel banks 31 is greater than the thickness of the first electrode 20. Optionally, the thickness of the first pixel banks 31 ranges from 0.1 µm to 0.6 µm.

S303: forming second pixel banks 32 in the second intervals 222 to form a pixel definition layer 30, wherein a thickness of the second pixel banks 32 is greater than the thickness of the first pixel banks 31, and the second pixel banks 32 cover portions of the first pixel banks 31 and portions of the first electrodes 20, so that each of printing grooves 321 is formed between adjacent ones of the second pixel banks 32.

Figure 11:
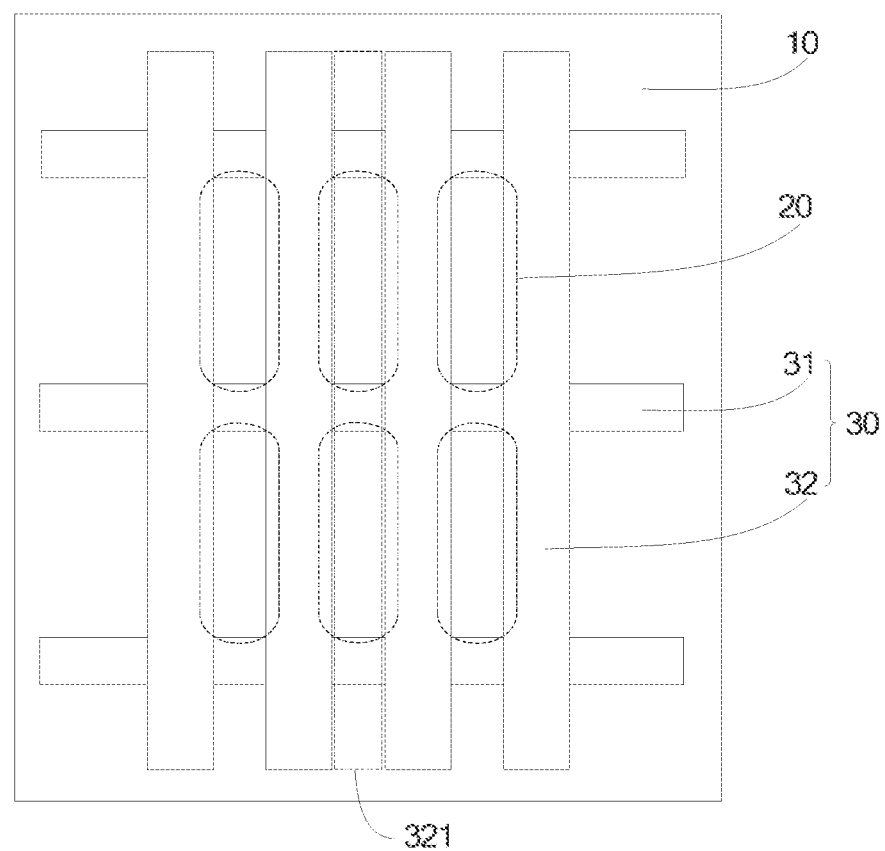

Specifically, a hydrophobic organic material is blanketly deposited on the first pixel banks 31, the first electrode 20, and the array substrate 10, and the hydrophobic organic material is patterned to form the second pixel banks 32. The second pixel banks 32 correspond to the second intervals 222, and the second pixel banks 32 cover portions of the first pixel banks 31 and portions of the first electrodes 20 to form a pixel definition layer 30, as shown in FIG. 11. The portions of the first pixel banks 31 covered by the second pixel banks 32 refer to portions of the first pixel banks 31 overlapping the second pixel banks 32; the portions of the first pixel banks 31 covered by the second pixel banks 32 include the long sides 22 of the first electrodes 20 and the short sides 21 of the first electrodes 20 not covered by the first pixel banks 31. A thickness of the second pixel banks 32 is greater than a thickness of the first pixel banks 31, and optionally, the thickness of the second pixel banks 32 ranges from 0.8 µm to 2 µm.

Since the second pixel banks 32 cover portions of the first pixel banks 31 and portions of the first electrodes 20, and the thickness of the second pixel banks 32 is greater than the thickness of the first pixel banks 31, printing grooves 321 are formed between adjacent ones of the second pixel banks 32, as shown in FIG. 11.

S304: continuously printing light-emitting materials of a same color in a same one of the printing grooves 321, and printing light-emitting materials of different colors in different ones of the printing grooves 321 to form a light-emitting layer 50, wherein the light-emitting layer 50 is formed on the first electrodes 20 which are not covered by the second pixel banks 32.

Figure 12:
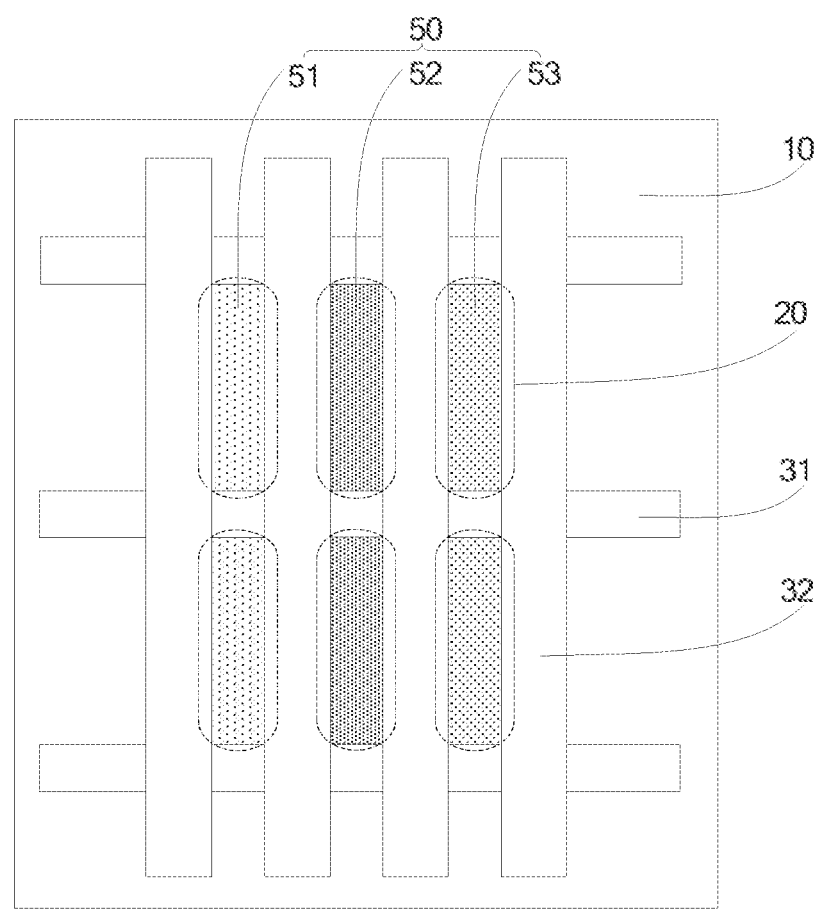

Specifically, light-emitting materials of different colors are dissolved in solvents to form different inks, and then inkjet printing is used to print the inks in the printing grooves 321 formed between adjacent ones of the second pixel banks 32. Inks made of light-emitting materials of different colors are printed in different ones of the printing grooves 32, and the ink is cured into a film to form a light-emitting layer 50, as shown in FIG. 12. Referring to FIG. 12 in conjunction with FIG. 4, the red light-emitting material 51, the green light-emitting material 52, and the blue light-emitting material 53 are arranged in different printing grooves 321 at intervals. Since the printing grooves 321 are continuous, ink can be continuously printed in the printing grooves 321, and the concentration of the ink can be prepared according to the thickness of the light-emitting layer 50.

Of course, FIG. 4 schematically shows three printing grooves 321, but the display panel 100 may include more first electrodes 20, so that more second pixel banks 32 can be provided to form more printing grooves 321, and thus the red light-emitting material 51, the green light-emitting material 52, and the blue light-emitting material 53 are sequentially and cyclically arranged in the more printing grooves 321. The thickness of the second pixel banks 32 is greater than a thickness of the light-emitting layer 50.

Meanwhile, the light-emitting materials of the same color between adjacent ones of the second pixel banks 32 are separated by the first pixel bank 31, so that the light-emitting materials only cover the first electrode 20 in the light-exiting areas, but not cover the first pixel bank 31. In addition, the light-emitting materials with different colors are printed in different printing grooves 321, so that the light-emitting materials of different colors are arranged at intervals between adjacent ones of the first pixel banks 31, and as such, in the first direction X, the light-emitting materials in adjacent ones of the light-emitting areas are different. That is, the first pixel banks 31 are used to define the light-emitting materials of the same color, and the second pixel banks 32 are used to define the light-emitting materials of different colors.

Optionally, the thickness of the first pixel banks 31 is greater than or equal to the thickness of the light-emitting layer 50.

In addition, when printing ink in the printing grooves 321, a volume of the inks is much larger than the volume of the light-emitting layer 50 after curing and forming into a film. Since the inks have fluidity, the first pixel banks 31 with hydrophilic characteristics can accelerate the flow of ink in the printing grooves 321 at this time so that the printed ink can be quickly dispersed in the areas defined by the first pixel banks 31 to prevent inks from accumulating and overflowing in a certain area, which can further improve efficiency of continuous printing. Meanwhile, the second pixel banks 32 with hydrophobic characteristics can prevent the printed inks from overflowing into adjacent ones of the printing grooves 321 and causing color mixing. Of course, the thickness of the second pixel banks 32 needs to match a height of the printed inks.

S305: depositing second electrodes 60 on the light-emitting layer 50.

Specifically, in order to realize light emission of the light-emitting layer 50, a second electrode 60 needs to be further provided, and the second electrode 60 covers the light-emitting layer 50 and the second pixel bank 32, as shown in FIG. 6. The first electrode 20 is an anode, and the second electrode 60 is a cathode, but the present application is not particularly limited thereto. The light-emitting layer 50 emits light under a collaboration of the first electrode 20 and the second electrode 60, and the array substrate 10 provides a driving voltage for the first electrode 20.

It should be noted that the method of manufacturing the display panel of the present application may further include preparing an encapsulation layer on the second electrode 60. The encapsulation layer may adopt thin film encapsulation, and the thin film encapsulation may be a stack structure composed of a first inorganic encapsulation layer, an organic encapsulation layer, and a second inorganic encapsulation layer which are stacked in sequence, or may be a stack structure of more layers, which are used to protect the light-emitting layer 50 by preventing water and oxygen from entering the light-emitting layer 50 and causing failure of the light-emitting material of the light-emitting layer 50.

An embodiment of the present application also provides a display device, which includes the display panel of one of the foregoing embodiments and other devices such a circuit board bound to the display panel, a cover plate covering the display panel, and the like.

According to the above embodiment, the present application provides a display panel, a manufacturing method thereof, and a display device; the array substrate of the display panel is provided with a plurality of first electrodes, first intervals and second intervals are defined between the plurality of first electrodes, a plurality of first pixel banks are arranged corresponding to the first intervals, and a plurality of second pixel banks are arranged corresponding to the second intervals, wherein the second pixel banks cross over the first pixel banks, a thickness of each of the first pixel banks and the second pixel banks is greater than a thickness of the first electrodes, and the thickness of the second pixel banks is greater than the thickness of the first pixel banks, so that the light-emitting materials of a same color can be continuously printed between adjacent ones of the second pixel banks, which solves the problem that the pixel definition layer of the existing SBS-type design cannot be continuously printed, thus impacting printing efficiency. Meanwhile, the first pixel banks are made of a hydrophilic organic material, which can quickly disperse the printed light-emitting materials in areas defined by the first pixel banks, thereby improving the printing efficiency; and the second pixel banks are made of a hydrophobic organic material to prevent the printed light-emitting materials from overflowing and causing color mixing.

In the above embodiments, the descriptions of each embodiment have their own emphasis. The parts that are not described in detail in an embodiment can be referred to the detailed descriptions in other embodiments above, which will not be repeated herein for brevity in for brevity.

The present application has been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not deviate from the spirit of the corresponding technical solutions beyond the scope of the technical solutions of the embodiments of the present application.

What is claimed is:

1. A display panel, wherein a pixel definition layer of the display panel comprises:
   a plurality of first pixel banks, arranged along a second direction and each extending along a first direction; and
   a plurality of second pixel banks, arranged along the first direction and each extending along the second direction,
   wherein adjacent ones of the first pixel banks and adjacent ones of the second pixel banks surround to define one of light-exiting areas; and an included angle is formed between the first direction and the second direction;
   in the second direction, light-emitting materials in the light-exiting areas are same, and a thickness of the second pixel banks is greater than a thickness of the first pixel banks; and
   the first pixel banks and the second pixel banks are made of a same material and are simultaneously integrated as a whole.

2. The display panel according to claim 1, wherein a material of the pixel definition layer comprises a hydrophobic organic material.

3. The display panel according to claim 1, wherein in the first direction, the light-emitting materials in adjacent ones of the light-exiting areas are different.

4. The display panel according to claim 1, wherein the display panel comprises:
   an array substrate;
   a plurality of first electrodes arranged in an array on the array substrate, wherein each of first intervals is formed between adjacent ones of the first electrodes in the first direction, and each of second intervals is formed between adjacent ones of the first electrodes in the second direction; and
   wherein the pixel definition layer is disposed on the first electrodes and the array substrate, the first pixel banks are disposed in the first intervals and cover portions of the first electrodes; and the second pixel banks are arranged in the second intervals and cover the first pixel banks and portions of the first electrodes; and
   wherein the light-exiting areas defined by the pixel definition layer correspond to the first electrodes, and the light-emitting materials covering the first electrodes form a light-emitting layer.

5. The display panel according to claim 4, wherein the thickness of the first pixel banks is greater than or equal to a thickness of the light-emitting layer.

6. The display panel according to claim 4, wherein the thickness of the first pixel banks is greater than a thickness of the first electrodes.

7. The display panel according to claim 1, wherein the thickness of the first pixel banks ranges from 0.1 micrometers to 0.6 micrometers, and the thickness of the second pixel banks ranges from 0.8 micrometers to 2 micrometers.

8. The display panel according to claim 4, wherein each of the plurality of first electrodes comprises short sides each extending along the first direction and long sides each extending along the second direction, each of the short sides has a shape of a circular arc, the first pixel banks cover portions of the short sides, and the second pixel banks cover the long sides and portions of the short sides not covered by the first pixel banks.

9. A display device comprising a display panel, a pixel definition layer of the display panel comprising:
   a plurality of first pixel banks, arranged along a second direction and each extending along a first direction; and
   a plurality of second pixel banks, arranged along the first direction and each extending along the second direction,
   wherein adjacent ones of the first pixel banks and adjacent ones of the second pixel banks surround to define one of light-exiting areas; and an included angle is formed between the first direction and the second direction;
   in the second direction, light-emitting materials in the light-exiting areas are same, and a thickness of the second pixel banks is greater than a thickness of the first pixel banks; and
   the first pixel banks and the second pixel banks are made of a same material and are simultaneously integrated as a whole.

10. The display device according to claim 9, wherein a material of the pixel definition layer comprises a hydrophobic organic material.

11. The display device according to claim 9, wherein in the first direction, the light-emitting materials in adjacent ones of the light-exiting areas are different.

12. The display device according to claim 9, wherein the display panel comprises:
   an array substrate;
   a plurality of first electrodes arranged in an array on the array substrate, wherein each of first intervals is formed between adjacent ones of the first electrodes in the first direction, and each of second intervals is formed between adjacent ones of the first electrodes in the second direction; and wherein the pixel definition layer is disposed on the first electrodes and the array substrate, the first pixel banks are disposed in the first intervals and cover portions of the first electrodes; and the second pixel banks are arranged in the second intervals and cover the first pixel banks and portions of the first electrodes; and wherein the light-exiting areas defined by the pixel definition layer correspond to the first electrodes, and the light-emitting materials covering the first electrodes form a light-emitting layer.

13. The display device according to claim 12, wherein the thickness of the first pixel banks is greater than or equal to a thickness of the light-emitting layer.

14. The display device according to claim 12, wherein the thickness of the first pixel banks is greater than a thickness of the first electrodes.

15. The display device according to claim 9, wherein the thickness of the first pixel banks ranges from 0.1 micrometers to 0.6 micrometers, and the thickness of the second pixel banks ranges from 0.8 micrometers to 2 micrometers.

16. The display device according to claim 12, wherein each of the plurality of first electrodes comprises short sides each extending along the first direction and long sides each extending along the second direction, each of the short sides has a shape of a circular arc, the first pixel banks cover portions of the short sides, and the second pixel banks cover the long sides and portions of the short sides not covered by the first pixel banks.

* * * * *